United States Patent
Miyazaki et al.

(10) Patent No.: US 9,231,587 B2
(45) Date of Patent: Jan. 5, 2016

(54) INPUT DEVICE HAVING ELECTRODES SHAPED TO ENHANCE CAPACITIVE SENSITIVITY AT A GIVEN POSITION

(75) Inventors: Kazuto Miyazaki, Daito (JP); Ichiro Kajitani, Fukushima (JP)

(73) Assignee: KYOCERA Corporation, Kyoto (JP)

( * ) Notice: Subject to any disclaimer, the term of this patent is extended or adjusted under 35 U.S.C. 154(b) by 108 days.

(21) Appl. No.: 13/818,927

(22) PCT Filed: Aug. 19, 2011

(86) PCT No.: PCT/JP2011/004636
§ 371 (c)(1),
(2), (4) Date: Feb. 25, 2013

(87) PCT Pub. No.: WO2012/026099
PCT Pub. Date: Mar. 1, 2012

(65) Prior Publication Data
US 2013/0240339 A1    Sep. 19, 2013

(30) Foreign Application Priority Data

Aug. 25, 2010 (JP) ................................. 2010-187897

(51) Int. Cl.
*H03K 17/975* (2006.01)
*H03K 17/96* (2006.01)
*G06F 3/02* (2006.01)
*H04M 1/23* (2006.01)

(52) U.S. Cl.
CPC .......... *H03K 17/9622* (2013.01); *G06F 3/0202* (2013.01); *H03K 17/962* (2013.01); *H04M 1/23* (2013.01); *H01H 2239/006* (2013.01); *H03K 2217/96073* (2013.01); *H03K 2217/960705* (2013.01); *H04M 2250/22* (2013.01)

(58) Field of Classification Search
USPC ..................... 200/5 A, 600; 341/33; 455/566; 345/173, 168, 169, 178
See application file for complete search history.

(56) References Cited

U.S. PATENT DOCUMENTS

| 7,129,935 B2 * | 10/2006 | Mackey | 345/174 |
| 8,072,429 B2 * | 12/2011 | Grivna | 345/173 |
| 2007/0008299 A1 * | 1/2007 | Hristov | 345/173 |
| 2013/0307793 A1 * | 11/2013 | Song et al. | 345/173 |

FOREIGN PATENT DOCUMENTS

| JP | 2007-087878 A | 4/2007 |
| WO | 2009/005026 A1 | 1/2009 |

OTHER PUBLICATIONS

International Search Report dated Oct. 25, 2011, issued for International Application No. PCT/JP2011/004636.

* cited by examiner

*Primary Examiner* — Vanessa Girardi
(74) *Attorney, Agent, or Firm* — Procopio, Cory, Hargreaves & Savitch LLP

(57) ABSTRACT

In order to improve operability when operating a target key, an input device has a plurality of keys arranged in a column direction. Each of the plurality of keys comprises a key indication mark (211) formed on an operation surface and an electrode plate (221) of a capacitive touch sensor disposed behind the operation surface, and the electrode plates (221*a*, 221*b* and so on) has a shape in which the top edge and the bottom edge are V-shaped and bend downwards so that the center of gravity of the electrode plate is positioned downwards in the column direction from a center of a minimum rectangle region enclosing the corresponding key indication marks (221*a*, 221*b* and so on).

7 Claims, 9 Drawing Sheets

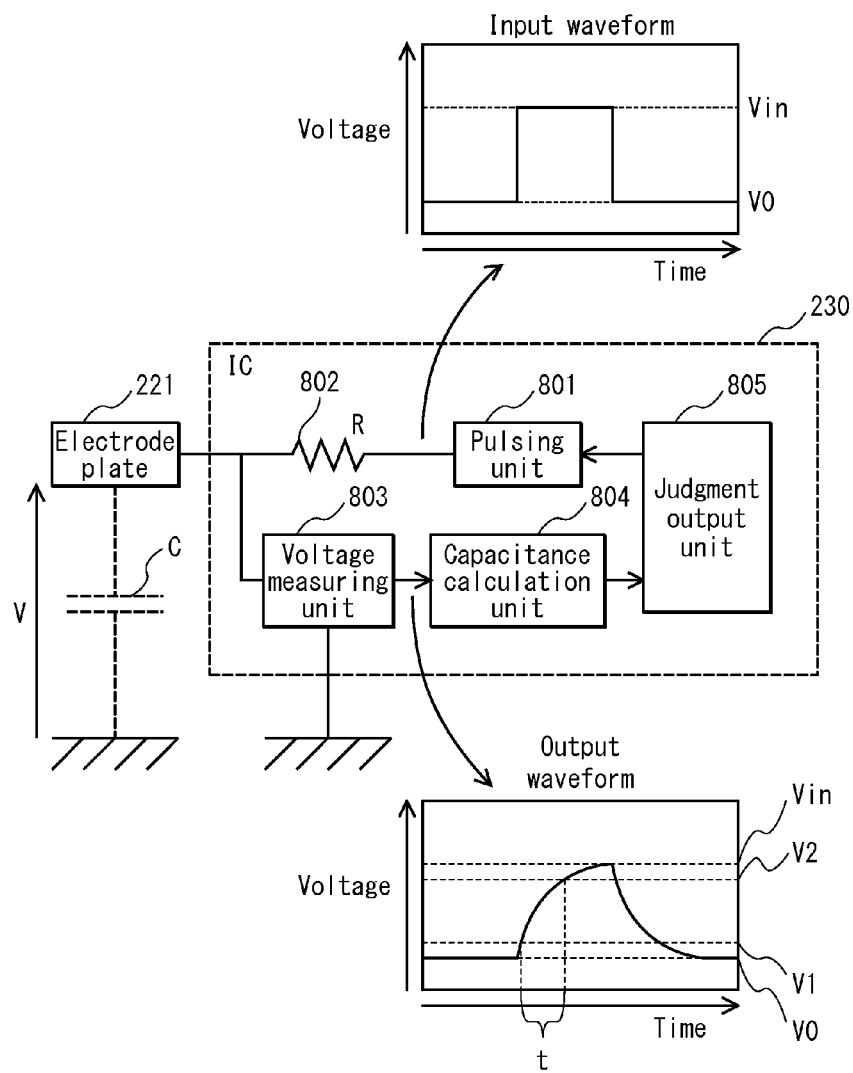

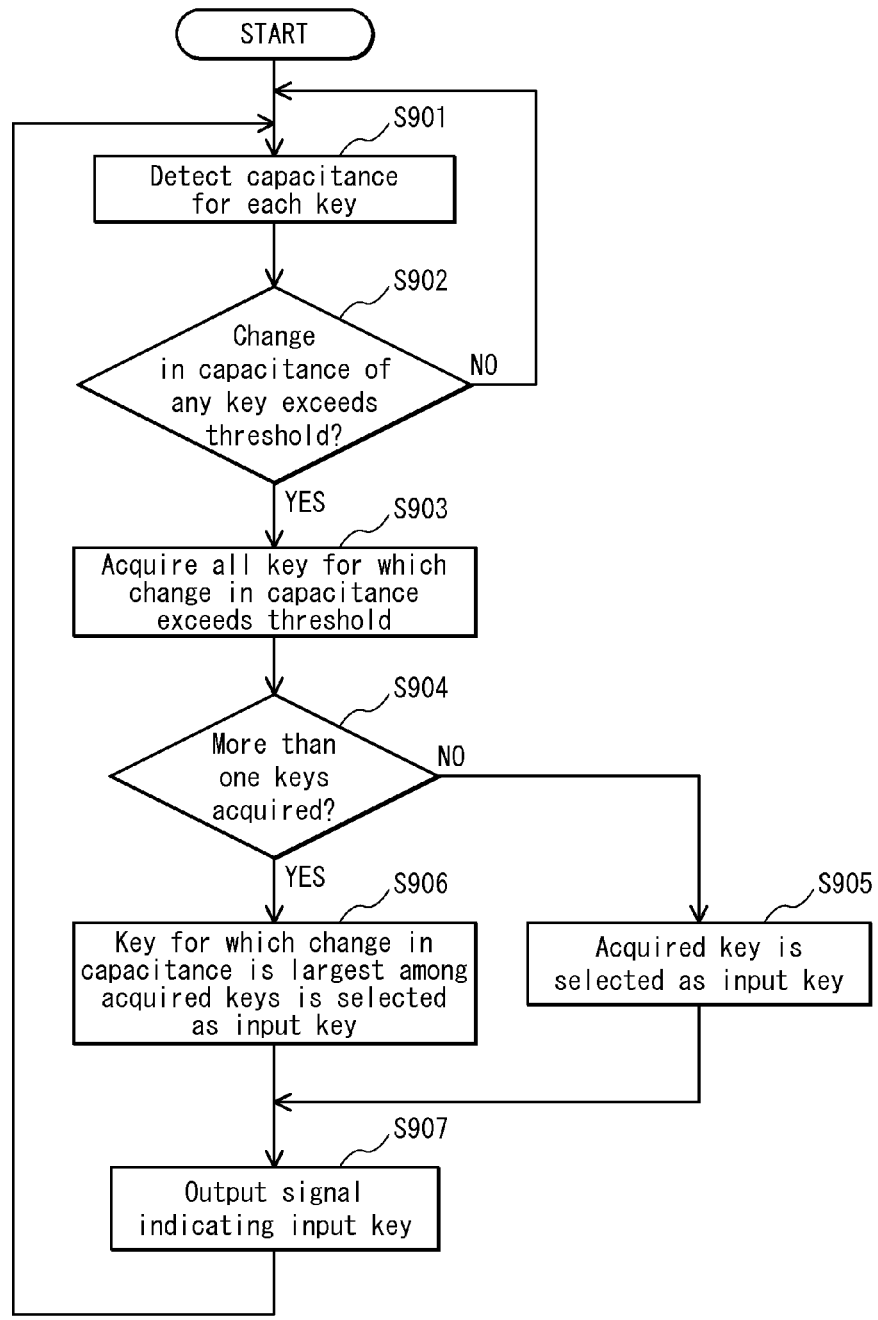

INPUT DEVICE HAVING ELECTRODES SHAPED TO ENHANCE CAPACITIVE SENSITIVITY AT A GIVEN POSITION

TECHNICAL FIELD

The present invention relates to an input device using keys which is provided in a mobile terminal and so on, and in particular to an input device provided with capacitive touch sensors.

BACKGROUND ART

Conventionally, the input device provided with capacitive touch sensors are well known (see, for example, Patent Literature 1 below).

The conventional input device has a plurality of capacitive touch sensors arranged in a matrix on the surface thereof. Each capacitive touch sensor includes a rectangular detection electrode and an indication mark printed on a sensor surface at a location directly above the rectangular detection electrode. The capacitive touch sensor detects a finger of a user being very close to or in contact with the indication mark, based on the change in capacitance.

CITATION LIST

Patent Literature

[Patent Literature 1]
Japanese Patent Application Publication No. 2007-087878

SUMMARY OF INVENTION

Technical Problem

When the above technology is applied to a mobile terminal, on which a plurality of small keys are arranged in a matrix with narrow spaced intervals (such as a mobile phone provided with a numeric keypad), each key is constructed to have a key-top with an indication mark printed, directly above an electrode of a capacitive touch sensor. However, the thus-constructed keys suffer from the following problem of input error.

When a user operates a target key among the set of keys arranged in a matrix using the forefinger, for example, not only the tip of the forefinger touches the target key, but also the pad of the forefinger comes in contact with or very close to a neighboring key positioned in the row directly below in the same column. Consequently, change in capacitance is also detected for this neighboring key, which results in an unintentional input error.

The present invention has been achieved in view of the above problem, and aims to provide an input device which enables the operability in operating a target key to be improved.

Solution to Problem

In order to solve the above problem, the input device according to the present invention is an input device having a plurality of keys arranged in a column direction, wherein each of the plurality of keys includes a key indication mark formed on an operation surface and an electrode unit of a capacitive touch sensor disposed behind the operation surface, and the electrode unit is shaped so that a center of gravity of the electrode unit is positioned downwards in the column direction from a center of a rectangle region enclosing the key indication mark. Here, the key indication mark may include one or more characters (including numerals), figures, symbols, and combinations thereof.

Advantageous Effects of Invention

According to this structure, the input device according to the present invention enables the operability in operating a target key to be improved.

BRIEF DESCRIPTION OF DRAWINGS

FIG. 6 is a view for explaining operations of an IC 230 for use with capacitive touch sensors.
FIG. 7 is a flowchart of input detection processing.

DESCRIPTION OF EMBODIMENTS

An input device 100 according to one embodiment of the present invention is described below with reference to the accompanying drawings.

<Structure>

Figure 1:
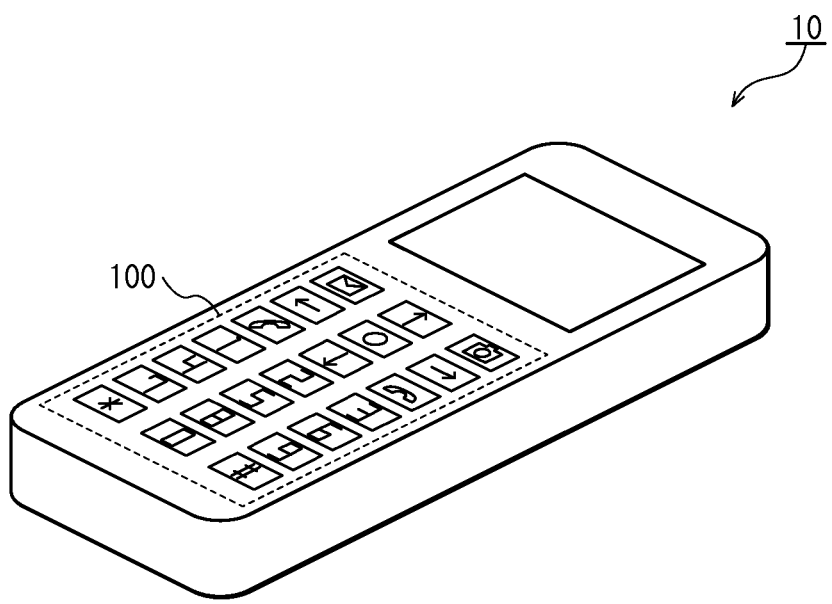
FIG. 1 is an external view of a mobile phone 10 provided with an input device 100.

As shown in FIG. 1, the input device 100 is provided in a mobile phone 10, and includes an operation surface having key indication marks such as numerals and arrows drawn thereon. The key indication marks each correspond to a key included in a set of keys such as a numeric keypad and directional keys. The user can input characters, telephone numbers and so on by touching the key indication marks with a finger.

Figure 2:
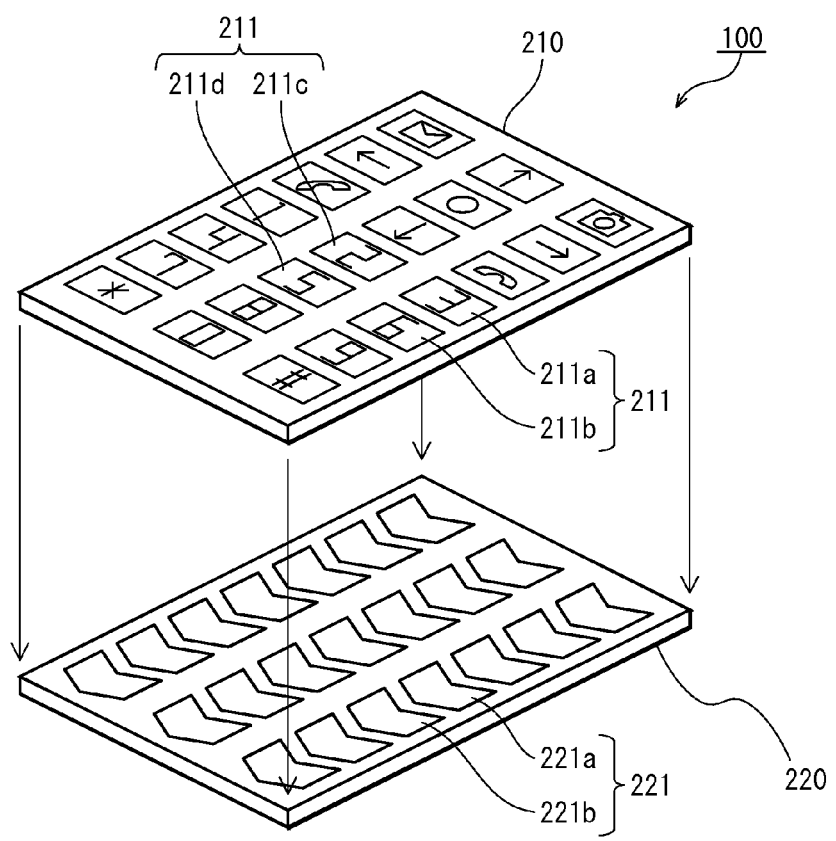
FIG. 2 is an exploded perspective view of a set of keys.

As shown in FIG. 2, the input device 100 has an assembly including a printed circuit board 220 and an opaque insulation sheet 210 layered on the front surface of the printed circuit board 220. The printed circuit board 220 is formed by a plurality of electrode plates 221 printed on the surface of a resin board in a matrix arrangement. Each electrode plate constructs a capacitive touch sensor. An IC (Integrated Circuit) 230 is disposed on the rear surface of the printed circuit board 220 for use with the capacitive touch sensors. Each electrode plate 221 is connected to one of the terminals of the IC 230 via wiring in an inner layer of the printed circuit board.

The front surface of the opaque insulation sheet 210 serves as the operation surface, on which key indication marks of the keys are printed in a color different from a background color.

Figure 3A:
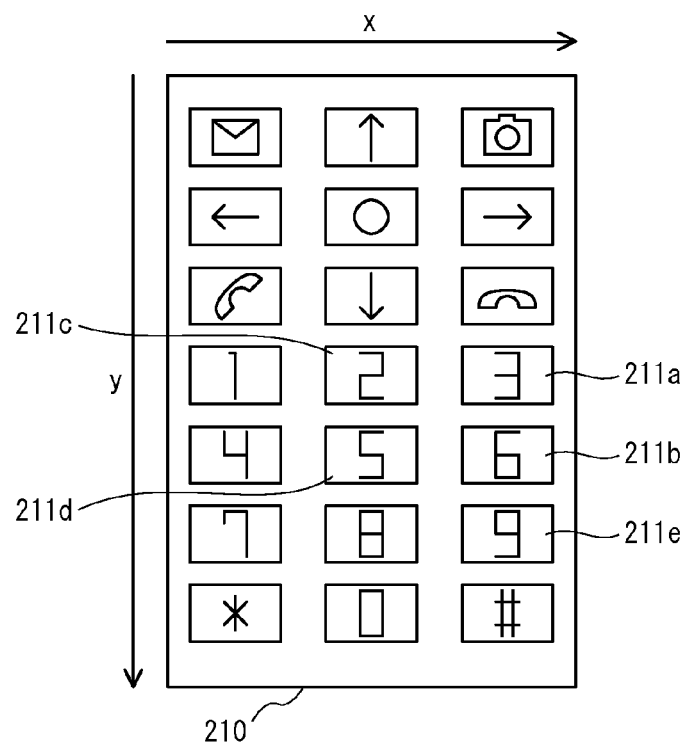
FIG. 3A is a plan view of an operation surface.

As shown in FIG. 3A, the keys on the operation surface are arranged in a matrix of seven rows and three columns. For example, with respect to keys "3", "6", and "9", the key indication marks 211a, 211b, and 211e, each of which is a rectangle enclosing a corresponding one of the numerals "3", "6", and "9", are arranged from high to low in the same column with equal intervals.

Figure 3B:
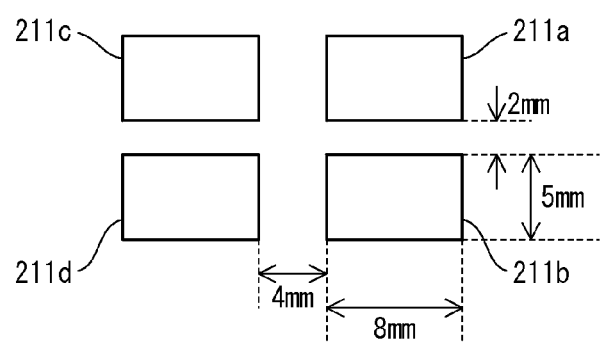
FIG. 3B shows the positional relationship between key indication marks.

FIG. 3B shows the intervals between neighboring keys on the operation surface (i.e., the intervals between the neighboring key indication marks 211a to 211d).

Figure 4A:
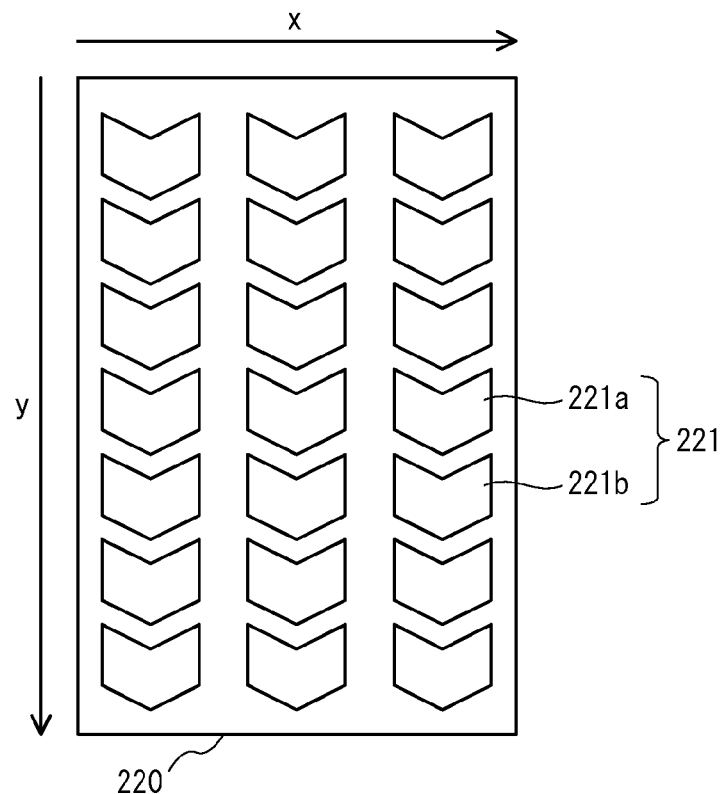
FIG. 4A is a plan view showing a surface on which electrode plates are arranged.

As shown in FIG. 4A, the plurality of electrode plates of the keys are arranged in a matrix of seven rows and three columns. Each electrode plate 221 has the dimensions shown in FIG. 4B.

Figure 4B:
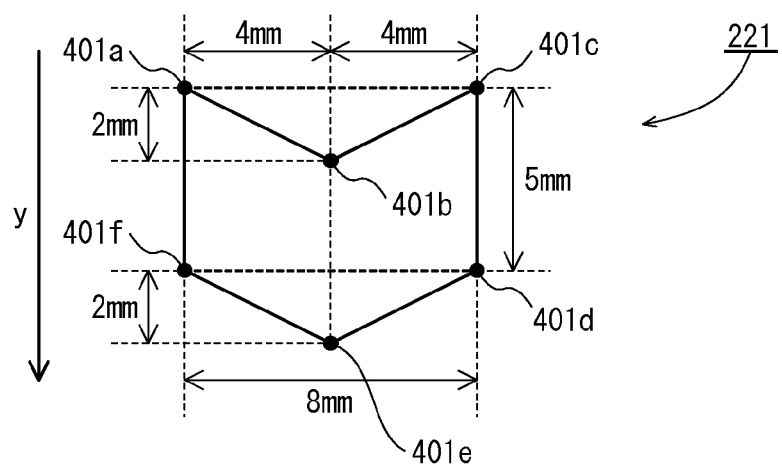
FIG. 4B shows the dimensions of the electrode plate.
Figure 5:
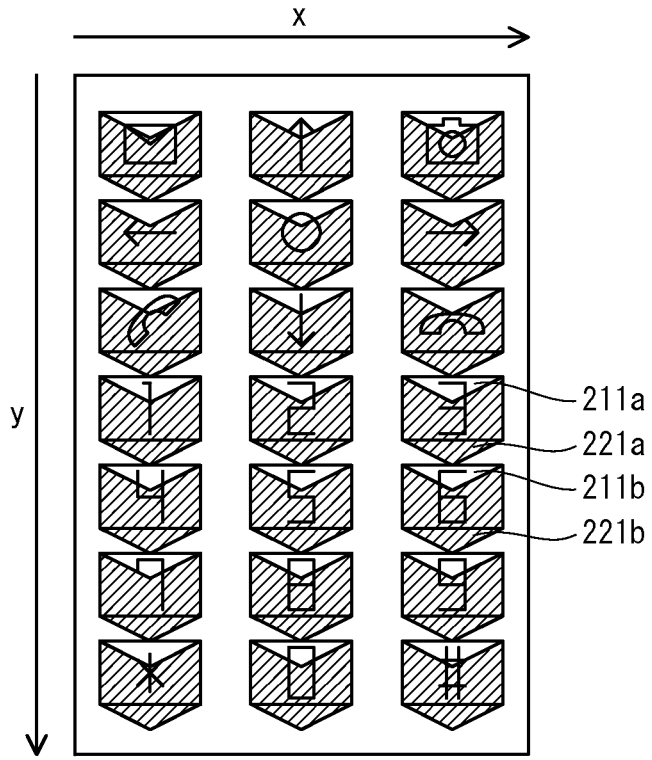
FIG. 5 shows the positional relationship between the key indication marks and the key electrode plates with an operation surface shown as transparent.

FIG. 5 shows a positional relationship between key indication marks and electrode plates with the operation surface shown as transparent. As shown in FIGS. 3 to 5, each electrode plate for detecting the change in capacitance with respect to the corresponding key is disposed behind the key indication mark of the corresponding key.

In other words, each key includes a portion of the operation surface having a corresponding key indication mark printed thereon and an electrode plate disposed behind (under) the portion of the operation surface. For example, the electrode plate 221a of the key "3" is disposed behind the key indication mark 211a of the key "3", and is shaped to have a top edge and a bottom edge each of which bends downwards at the central portion thereof. Similarly, behind the key indication mark 211b of the key "6", the electrode plate 221b of the key "6" is disposed.

The following describes the shape of the electrode plate 221 of the key in more detail. In a planar view, the top edge and the bottom edge of the electrode plate each define a V-shaped line (i.e., the top edge defines a polyline sequentially connecting vertices 401a, 401b, and 401c, and the bottom edge defines a polyline sequentially connecting vertices 401d, 401e, and 401f). The left side edge and the right side edge of the electrode plate define straight lines which respectively coincides with the left side edge and the right side edge of the rectangle forming the key indication mark of the corresponding key (see FIGS. 4 and 5).

As shown in FIG. 6, the IC 230 for use with the capacitive touch sensors has a circuit structure comprising a pulsing unit 801, resistor (R) 802, voltage measuring unit 803, capacitance calculation unit 804, and judgment output unit 805. The IC 230 performs input detection processing as follows. The IC 230 measures the capacitance C of capacitive elements, each of which has a ground layer on the printed circuit board facing the electrode plate with a dielectric resin layer interposed therebetween. With respect to each capacitive element, the IC 230 detects the change in the measured capacitance C due to stray capacitance generated when the finger of the user comes in contact with or very close to the electrode plate, and judges whether or not a key input has been made based on the detected change. Finally, the IC 230 outputs a signal indicating the input key. On receiving the signal output from the IC 230, a controlling processor (not shown) of the mobile phone 10 performs processing according to the input key, for example, accepting the number corresponding to the key as a telephone number and making an outgoing call, or accepting the character corresponding to the key for preparing a sentence of an e-mail message which is to be sent. When the finger comes in contact with or very close to the electrode plate, the stray capacitance increases as the area of the finger of the user facing the electrode plate increases, on the premise that the distance between the finger and the electrode plate is unchanged.

The IC 230 measures the above capacitance C as described below. The pulsing unit 801 periodically applies a pulse wave to each electrode plate 221 constructing the corresponding key via the resistor (R) 802. The voltage measuring unit 803 measures the voltage V between potentials of the electrode plate and the ground. The capacitance calculation unit 804 computes the capacitance C of the capacitive element formed between the electrode plate and the ground layer based on the elapsed time during which the value of the above voltage V changes from one threshold value V1 to another threshold value V2. When the value of the capacitance C with respect to a certain key changes from a reference value corresponding to a state where the user makes no operation by a value no less than a given threshold value, the judgment output unit 805 judges that the finger of the user has come in contact with or very close to the electrode plate constructing the key (i.e., judges that a key input has been made). This given threshold value is determined in advance so that the difference between the capacitance C and the reference value exceeds the given threshold value when the finger comes in contact with the electrode plate over an area of appropriately 20% or more of the electrode plate.

<Operations of the IC for Use with the Capacitive Touch Sensors>

FIG. 7 is a flowchart showing the input detection by the IC 230.

The IC 230 identifies values of capacitance C obtained via the electrode plates of the keys arranged in the matrix of seven rows and three columns by means of, for example, row/column numbers being a combination of a row number and a column number in the matrix. For example, the row/column number for the key "3" is identified by a combination of a row number "4" and a column number "3", the row/column number for the key "6" is identified by a combination of a row number "5" and a column number "3" (see FIG. 3).

The IC 230 computes the capacitance C from measurements made for the electrode plates constituting the keys (step S901). When the change in capacitance with respect to any key exceeds the given threshold value, the IC 230 temporally stores the row/column number corresponding to the key (steps S902 and S903). The IC 230 judges whether more than one row/column number is stored (step S904). When the IC 230 judges that one row/column number is stored, the IC 230 determines that the key identified by the one row/column number is the input key (step S905), and outputs a signal indicating this key to the controlling processor of the mobile phone 10 (step S907). If the IC 230 judges that more than one row/column number is stored in the step S904, the IC 230 selects, as the input key, one of the keys for which the largest change is detected in the capacitance C (step S906), and outputs a signal indicating the selected key (i.e., a signal indicating the row/column number corresponding to the selected key) to the controlling processor of the mobile phone 10 (step S907).

<Key Operation>

The following describes, in details, the judgment made on the key input when the user makes a key operation using the input device 100, with reference to FIG. 8.

When operating the input device 100 having the operation surface on which the key indication marks corresponding to the keys are arranged in a matrix, the user generally holds the input device in an orientation in which the set of the key indication marks drawn on the input device 100 (for example, "3", "6" and "9") are readable for the user, in particular, in an orientation in which the key indication mark of the key "3" is in a position upper than those of the keys "6" and "9". The user operates the device held in this orientation using the finger pointed in the direction shown in FIG. 8A. In other words, the user operates the input device generally in an orientation in which the upper side of each key indication mark faces the upper direction of the column and the lower side of the key indication mark faces the lower direction of the column. Here, the upper side and the lower side of the key indication mark are those in an orientation in which the user generally reads the key indication mark. Accordingly, when the key indication mark is a character, the top thereof faces the upper direction and the bottom thereof faces the lower direction.

Figure 8A:
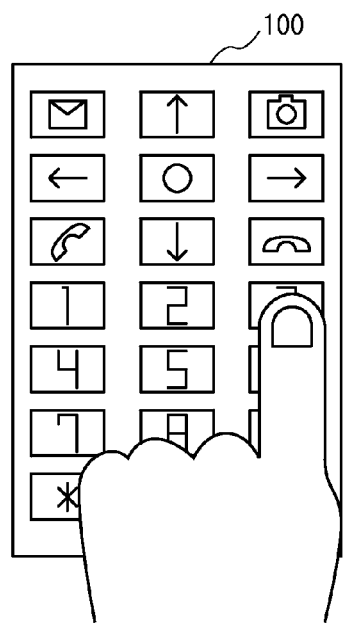
FIG. 8 show contact positions of a finger during a key operation.

In FIG. 8A, the user operates the key "3" using the forefinger.

Figure 8B:
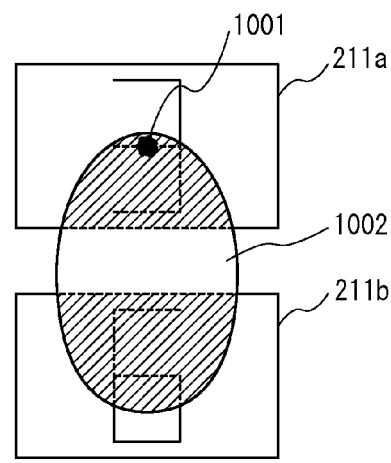
Figure 8C:
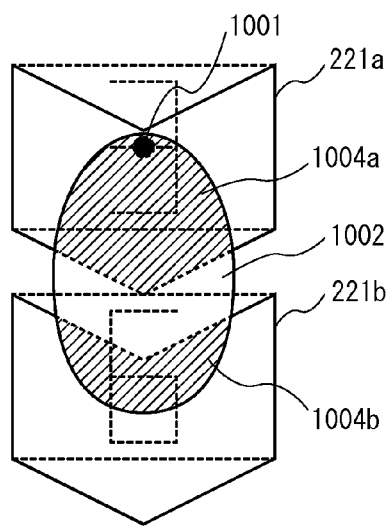
Figure 8D:
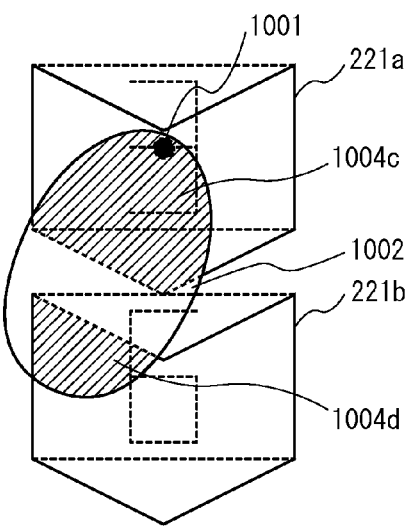

In FIG. 8B, each shaded region represents a portion of the key indication mark which is in contact with or very close to the user's finger during the operation shown in FIG. 8A. FIGS. 8B to 8D also show a finger region 1002 and a fingertip 1001, assuming that the user has a standard sized finger.

As shown in FIG. 8B, when the standard user operates the key "3", the fingertip 1001 of the forefinger touches the key indication mark 211a of the key "3" at the center thereof, and the pad of the forefinger comes in contact with or very close to the key indication mark 211b of the key "6".

In FIG. 8C, each shaded region represents the portion of the electrode plate of the key which is in contact with or very close to the user's finger during the operation shown in FIG. 8A.

As shown in FIG. 8C, when the user operates the key "3", the tip of the forefinger touches the electrode plate 221a of the key "3", and the pad of the forefinger is in contact with or very close to the electrode plate 221b of the key "6". Due to the shape of electrode plates defined by V-shaped top and bottom edges, the area of the portion 1004a where the finger is in contact with or very close to the electrode plate 221a of the key "3" is larger than the area of the portion 1004b where the finger is in contact with or very close to the electrode plate 221b of the key "6". Accordingly, in the step S906 of the input detection processing, the IC 230 judges this operation to be the input of the key "3" rather than the key "6" because the capacitance computed from the area of the portion 1004a for the key "3" is larger than the capacitance computed for the key "6".

FIG. 8D shows the shaded regions representing the portions of the electrode plates of the keys which are in contact with or very close to the user's finger when the user operates the key "3" with the forefinger pointed in a slightly inclined direction. As shown here, even when the operation is made using a finger slightly inclined, since each electrode plate is shaped to define V-shaped lines, the area of the portion 1004c where the finger is in contact with or very close to the electrode plate 221a of the key "3" is larger than the area of the portion 1004d where the finger is in contact with or very close to the electrode plate 221b of the key "6". Accordingly, even when the operation is made using a finger pointed in an inclined direction, the IC 230 judges that input has been made for the key "3" rather than the key "6" in the step S906 of the input detection processing.

As described above, while the center of a key indication mark of a key in a conventional input device coincides with the center of gravity of an electrode plate of the key, the input device according to the present invention is configured so that the center of gravity of the electrode plate of each key is offset downwards in the column direction from the center of the corresponding key indication mark (i.e., the center of a rectangular region enclosing the key indication mark). Accordingly, when the user operates one of the keys as the target key by touching the key indication mark of the target key using, for example, the forefinger, the pad of the forefinger falls within the detection range for the electrode plate corresponding to the target key when the tip of the forefinger touches the target key. On the contrary, it is more likely that the portion of the pad of the finger does not fall within the detection range for the electrode plate of the neighboring key positioned below the target key in the column direction. Accordingly, this input device according to the present invention reduces unintentional input errors by the user, and thus improves the operability.

<Modifications>

Though the input device according to the present invention has been described above based on the embodiment thereof, the input device 100 described as one example may be modified in various ways. It is natural that the present invention is not exactly limited to the input device 100 as described in the above embodiment.

(1) Though each key indication mark shown in the above embodiment is formed by a rectangle enclosing one character, arrow and so on, one key indication mark may include a plurality of characters. For example, a numeral "2" and characters "ABC" may be arranged with a gap on one key indication mark corresponding to one key. In addition, though each key indication mark shown in FIG. 3A and so on is formed by a numeral (for example, "3") enclosed by a rectangular frame, the rectangular frame may be omitted.

Though the key indication marks are described to be printed in a color different from the background color, they may be formed by a method other than printing as long as the user can visually recognize them. For example, the key indication marks may be engraved on the operation surface. In another example, the key indication marks may be illuminated by a light emitted from a source such as an LED (Light Emitting Diode) disposed behind the operation surface so that the key indication marks may be seen as if relieved from the operation surface.

(2) With respect to each key shown in the above embodiment, the electrode plate serving as a part of the capacitive touch sensor has the dimensions and shape shown in FIG. 4B. In addition, the key indication mark and the electrode plate have the positional relationship shown in FIG. 5. However, the dimensions, shape, and the positional relationship with respect to the keys are not limited to those shown in FIG. 4B and FIG. 5. In other words, the keys may have different dimensions, shape or position from those shown in the above embodiment as long as, in a planar view, the key has an electrode plate shaped to have the center of gravity thereof positioned downwards from the center of the key indication mark of the key or the center of the rectangle enclosing the character in the key indication mark. However, the electrode plate of one key is required to be positioned so that, in a planar view, the front surface region of the electrode plate includes at least a portion of the key indication mark of the key without covering the key indication marks of other keys entirely.

Figure 9A:
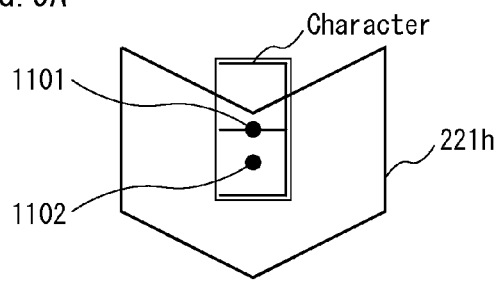
FIG. 9 show variations of the key.

For example, a key as shown in FIG. 9A may be usable, for which the center of gravity 1102 of the electrode plate 221h is positioned downwards from the center 1101 of the key indication mark including a single numeric "3". Similarly, keys shown in FIGS. 9B to 9G may be usable. Though FIG. 9 show the key "3" only, the same key configuration applies to other keys.

Figure 9B:
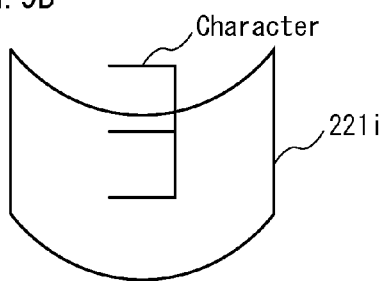
Figure 9C:
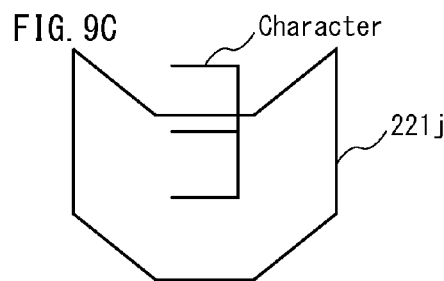
Figure 9D:
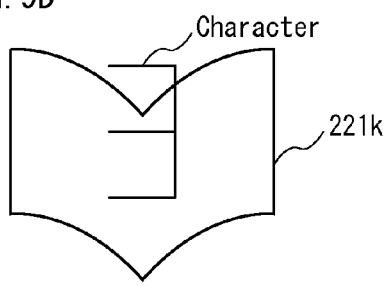
Figure 9E:
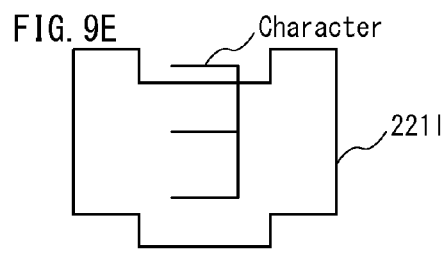
Figure 9F:
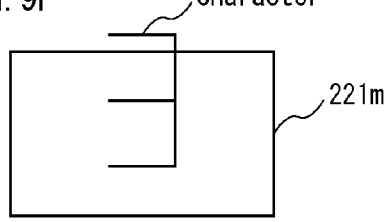
Figure 9G:
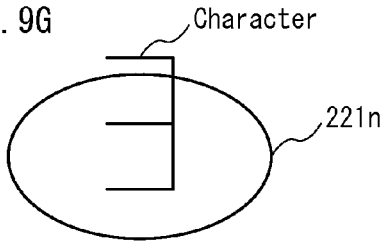

The electrode plate shown in FIG. 9B has a shape whose top edge and bottom edge form a downward arc. According to this shape, even when the user operates the key with the finger inclined, the IC for use with the capacitive touch sensor judges that the target key has been input rather than the other key in the row below, as long as the inclination of the finger is within the range of the central angle of the arc. This is because the contact area of the target key with the finger is larger than that of the other key which is in the same column and in the row directly below. The above arc may be an arc of a circle.

The shape of the electrode plate is not required to be symmetrical. However, if symmetrical, the electrode plate may make the same response when the user operates it using a finger inclined to right and when using a finger inclined to left. In another modification, even if the geometric center (center of gravity) of the outline of the electrode plate is positioned to coincide with the center of the shape of the key indication mark, the same advantage may be obtained by shifting the center of gravity of the body of the electrode plate to a position below the center of the outline thereof. This shifting is achieved by forming a plurality of holes in the upper portion of the electrode plate in a planar view.

(3) Though the above-mentioned IC for use with the capacitive touch sensor judges whether or not a key input has been made by measuring the change in the capacitance between the electrode plate and the ground layer of the key, any other method or processing may be used for the measuring or the key input judgment. For example, it is possible to adjust appropriately the threshold values V1 and V2 or the given threshold value based on experimental results and so on, during the design stage or manufacturing stage of the input device (the threshold values V1 and V2 are the values to be compared with the measured voltage, and the given threshold value is the value to be compared with the difference between the measured value of the capacitance C and the reference value). In addition, in the step S906 of the input detection processing (FIG. 7), when the change in capacitance exceeds the given threshold value with respect to a plurality of keys, the one for which the change in capacitance is largest is selected and determined as the input key. However, the key whose row number indicated by the corresponding row/column number is smallest (i.e., the uppermost key among the plurality of keys) may be selected and determined as the input key. Also in the step S907, some other signal for specifying the key may be output instead of the signal indicating the row/column number. In addition, the sharing of the processing between the IC and the controlling processor of the mobile phone may be changed as long as they are structured so that the key input by the user can be identified in the mobile phone.

(4) In the above embodiment as shown in FIG. 4, with respect to all the keys, the center of gravity of the shape of the electrode plate is positioned downwards. However, it may suffice that the electrode plate of at least one of the keys has a shape whose center of gravity is positioned downwards.

In addition, in the above embodiment as shown in FIG. 4, all the electrode plates have the same shape with respect to all the keys. However, the electrode plates of the keys may have different shapes.

In addition, in the above embodiment as shown in FIG. 4, with respect to the keys in the uppermost row of the matrix, each electrode plate has the top edge shaped to bend downwards. However, there is no key above the uppermost row of keys in the matrix. Accordingly, the top edge of the electrode plate of the key in the uppermost row of the matrix may not be shaped to bend downwards.

In addition, in the above embodiment as shown in FIG. 4, with respect to the keys in the bottom row of the matrix, each electrode plate has the bottom edge shaped to bend downwards. However, there is no key below the bottom row of the keys in the matrix. Accordingly, the bottom edge of the electrode plate of the key in the bottom row of the matrix may not be shaped to bend downwards.

In addition, in the above embodiment as shown in FIG. 4, both of the top edge and the bottom edge of each electrode plate are shaped to bend downwards. However, at least one of the top edge and bottom edge of the electrode plate may bend downwards as long as the center of gravity of the shape is positioned downwards.

(5) The above embodiment and variants may be combined in part or in whole.

(6) The following describes the structure of the input device and mobile terminal by way of one embodiment of the present invention, and variants and advantages thereof.

(a) An input device according to one embodiment of the present invention is an input device having a plurality of keys arranged in a column direction, wherein each of the plurality of keys includes a key indication mark formed on an operation surface and an electrode unit of a capacitive touch sensor disposed behind the operation surface, and the electrode unit is shaped so that a center of gravity of the electrode unit is positioned downwards in the column direction from a center of a rectangle region enclosing the key indication mark. Incidentally, when the key indication mark includes a character, the bottom side of the character coincides with the lower side in the column direction. According to this structure, each key is constructed so that the center of gravity of the electrode unit is offset below in the column direction from the center of the rectangle region enclosing the key indication mark (for example, the center of the smallest rectangle region enclosing the key indication mark; that is, the center of the key indication mark). Therefore, in an attempt to operate a target key using, for example, the forefinger, the user puts the tip of the forefinger on the target key following the key indication mark thereof. At this time, it is more likely that the pad of the forefinger falls within the detection range for the electrode unit of the target key and falls outside the detection range for the electrode unit of the neighboring key below the target key in the column direction. Consequently, the input device enables unintentional input errors by the user to be reduced, and thus improves the operability.

(b) In the input device, the electrode unit may have a shape in which at least one of a top edge and a bottom edge bends downwards in a planar view. According to this structure, at least one of the top edge and the bottom edge of each electrode unit bend downwards. Therefore, when the user puts the tip of the finger on one of the keys arranged in a column as the target key, the area where the pad of the finger faces the electrode unit of the key below the target key is reduced. This reduces the risk of unintentional input of the key below, and thus improves the operability.

(c) In the input device, the at least one of the top edge and the bottom edge of the shape of the electrode unit may define a V-shaped polyline. In addition, the left edge and the right edge of the shape of the electrode unit may be straight in the vertical direction. the shape of the electrode unit may be bilaterally symmetrical in a planar view. According to this structure, input errors are reduced when the user makes an operation with the finger slightly inclined to right (see FIG. 8(d)) or inclined to left. This improves the operability.

(d) In the input device, the at least one of the top edge and the bottom edge of the shape of the electrode unit of the key may form an arc. According to this structure, input errors are reduced when the user operates a key using a finger inclined with an angle within the range of the central angle of the arc. This improves the operability.

(e) A mobile terminal including the input device according to one embodiment of the present invention is a mobile terminal comprising a numeric keypad having a plurality of keys arranged in a matrix of M rows×N columns (M≥2, N≥1), each key including a key indication mark formed on an operation surface and an electrode unit of a capacitive touch sensor disposed behind the operation surface, wherein the electrode unit of the each key is shaped so that the center of gravity of the electrode unit of the each key is positioned downwards from a center of a rectangle region enclosing the key indication mark in a column direction. This structure enables unintentional input errors on a numeric keypad by the user to be reduced, and thus improves the operability.

INDUSTRIAL APPLICABILITY

A device of the present invention can be used for avoiding an unintentional input of a neighboring key of a target key during the operation of the target key, and, therefore, is advantageously used in a mobile phone and so on.

REFERENCE SIGNS LIST 10 mobile phone
100 input device
210 insulation sheet
211 key indication mark
220 printed circuit board
221 electrode plate (electrode unit)
230 IC (integrated circuit)

The invention claimed is:

1. An input device having a plurality of keys with corresponding key indication marks, arranged in a column direction, wherein:
  each of the plurality of keys includes a corresponding key indication mark formed on an operation surface and a capacitive touch sensor comprising corresponding electrode plates formed on a printed circuit board (PCB), and
  each electrode plate is only partially disposed behind the corresponding key indication mark such that a lower portion of the electrode plate extends beyond a lower edge of the respective key indication mark and an upper portion of the electrode plate overlaps the key indication mark and;
  whereupon in response to an actuation of the input device, a finger region is identified to include portions of first and second adjacent key indication marks corresponding to first and second adjacent keys and corresponding first and second electrode plates, where one of the first and second keys is selected based on relative portions of the first and second electrode plates encompassed by the finger region.

2. The input device according to claim 1, wherein the electrode unit has a shape in which at least one of a top edge and a bottom edge bends downwards in a planar view.

3. The input device according to claim 2, wherein the at least one of the top edge and the bottom edge of the shape of the electrode unit defines a V-shaped polyline.

4. The input device according to claim 2, wherein the shape of the electrode unit is bilaterally symmetrical in a planar view.

5. The input device according to claim 2, wherein the at least one of the top edge and the bottom edge of the shape of the electrode unit of the key forms an arc.

6. The input device according to claim 2, wherein a left edge and a right edge of the shape of the electrode unit of the key are straight in the column direction.

7. A mobile terminal comprising a numeric keypad having a plurality of keys according to claim 1, arranged in a matrix of M rows×N columns (M>2, N>1).

* * * * *